United States Patent
Nishiura et al.

(10) Patent No.: US 7,619,301 B2
(45) Date of Patent: Nov. 17, 2009

(54) GAAS SEMICONDUCTOR SUBSTRATE AND FABRICATION METHOD THEREOF

(75) Inventors: Takayuki Nishiura, Itami (JP); Yoshio Mezaki, Itami (JP); Yusuke Horie, Itami (JP); Yasuaki Higuchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 13 days.

(21) Appl. No.: 11/907,017

(22) Filed: Oct. 9, 2007

(65) Prior Publication Data
US 2008/0296738 A1 Dec. 4, 2008

(30) Foreign Application Priority Data
Jun. 1, 2007 (JP) ............ 2007-147336

(51) Int. Cl.
H01L 29/201 (2006.01)
C23G 1/02 (2006.01)
(52) U.S. Cl. ............ 257/631; 257/E29.089; 134/3
(58) Field of Classification Search ......... 257/631, 257/E29.089; 134/3; 438/825
See application file for complete search history.

(56) References Cited

U.S. PATENT DOCUMENTS

| | | | |
|---|---|---|---|
| 2004/0099290 A1* | 5/2004 | Morinaga et al. | 134/27 |
| 2006/0054181 A1* | 3/2006 | Rayandayan et al. | 134/1 |

FOREIGN PATENT DOCUMENTS

| | | | |
|---|---|---|---|
| JP | 06-124863 | | 5/1994 |
| JP | 07-165499 A | | 6/1995 |
| JP | 07-201689 | | 8/1995 |
| JP | 2000-206065 A | | 7/2000 |
| JP | 3306894 | | 5/2002 |
| JP | WO2006001117 | * | 6/2004 |
| JP | EP 1763071 | * | 4/2005 |

OTHER PUBLICATIONS

Wolan et al., "Characterization study of GaAs (001) surfaces using ion scattering spectroscopy and x-ray photoelectron spectroscopy", 1997, J. Appl. Physi., vol. 81 No. 9 pp. 6160-6164.*
European Search Report issued in European Patent Application No. EP 07019734 dated Apr. 15, 2009.

* cited by examiner

Primary Examiner—Thomas L Dickey
Assistant Examiner—Nikolay Yushin
(74) Attorney, Agent, or Firm—McDermott Will & Emery LLP (57) ABSTRACT

A GaAs semiconductor substrate includes a surface layer. When an atomic ratio is to be calculated using a 3d electron spectrum of Ga atoms and As atoms measured at the condition of 10° for the photoelectron take-off angle θ by X-ray photoelectron spectroscopy, the structural atomic ratio of all Ga atoms to all As atoms (Ga)/(As) at the surface layer is at least 0.5 and not more than 0.9, the ratio of As atoms bound with O atoms to all Ga atoms and all As atoms (As—O)/{(Ga)+(As)} at the surface layer is at least 0.15 and not more than 0.35, and the ratio of Ga atoms bound with O atoms to all Ga atoms and all As atoms (Ga—O)/{(Ga)+(As)} at the surface layer is at least 0.15 and not more than 0.35. Accordingly, there is provided a GaAs semiconductor substrate having a surface cleaned to an extent allowing removal of impurities and oxides at the surface by at least thermal cleaning of the substrate.

2 Claims, 7 Drawing Sheets

GAAS SEMICONDUCTOR SUBSTRATE AND FABRICATION METHOD THEREOF

BACKGROUND OF THE INVENTION

1. Field of the Invention

The present invention relates to a GaAs semiconductor substrate having a clean surface, conveniently employed as the substrate for various semiconductor devices such as a light emitting device, electronic device, and semiconductor sensor, and a fabrication method of such a GaAs semiconductor substrate.

2. Description of the Background Art

A GaAs semiconductor substrate conveniently employed as the substrate of various semiconductor devices such as a light emitting device, electronic device, and semiconductor sensor has a dangling bond at the surface. Therefore, the surface will be modified due to the adhesion of impurities and formation of oxides at the surface. If a semiconductor layer is grown on a GaAs semiconductor substrate with impurities or oxides at the surface to further produce a semiconductor device, the impurities and/or oxides will be introduced into the semiconductor device to degrade the property thereof.

In view of this issue, a GaAs semiconductor substrate, when a semiconductor layer is to be grown thereon, is heated to approximately 500 to 600° C. in order to remove the impurities and/or oxides present at the surface of the GaAs semiconductor substrate prior to formation of the semiconductor layer (thermal cleaning of the surface of the GaAs semiconductor substrate). However, the surface of the GaAs semiconductor substrate is readily oxidized, so that an oxide that cannot be removed even by the aforementioned thermal cleaning of the surface may be produced. In particular, the melting point of $Ga_2O_3$, that is such an oxide of Ga is 1795° C., which is extremely high, and cannot be removed by the general thermal cleaning carried out at approximately 500 to 600° C.

There have been various approaches to provide a GaAs semiconductor substrate having a clean surface, absent of adhesion of impurities and formation of oxides. For example, Japanese Patent Laying-Open No. 07-201689 discloses a semiconductor wafer with a protection film, having a Langmuir-Blodgett film formed on the surface of the GaAs wafer, followed by a coating of a high polymer film thereon. However, the semiconductor wafer with a protection film disclosed in Japanese Patent Laying-Open No. 07-201689 employs a surface active agent formed of a hydrocarbon compound of macromolecules. Therefore, carbon atoms and/or oxygen atoms originating from the surface active agent will remain on the surface of the semiconductor wafer even if thermal cleaning is carried out prior to growth of a semiconductor layer. There was a problem that the property of the semiconductor device is degraded.

Japanese Patent Laying-Open No. 06-124863 discloses a GaAs compound semiconductor substrate subjected to final polishing, wherein the difference between the atomic ratio of gallium to arsenic in the area within 10 nm from the substrate surface (Ga/As) and the atomic ratio of gallium to arsenic at the (110) cleavage plane $(Ga/As)_C$ does not exceed ±0.2. However, even if (Ga/As) is set to approximate $(Ga/As)_C$, i.e. the stoichiometric composition ratio, the presence of many Ga at the surface of the substrate will lead to the formation of $Ga_2O_3$, that has an extremely high melting point (1795° C.) due to oxidization of Ga at the surface. Therefore, $Ga_2O_3$, cannot be removed by the general thermal cleaning that is carried out at approximately 500° C.-600° C.

SUMMARY OF THE INVENTION

An object of the present invention is to provide a GaAs semiconductor substrate having a surface cleaned to an extent allowing removal of impurities and oxides at the surface by at least thermal cleaning of the substrate, and a fabrication method of such a GaAs semiconductor substrate.

The present invention is directed to a GaAs semiconductor substrate having a surface layer, wherein, when an atomic ratio is calculated using a 3d electron spectrum of Ga atoms and As atoms measured at a condition of 10° for a photoelectron take-off angle θ by X-ray photoelectron spectroscopy, a structural atomic ratio of all Ga atoms to all As atoms (Ga)/(As) at the surface layer is at least 0.5 and not more than 0.9, a ratio of As atoms bound with O atoms to all Ga atoms and all As atoms (As—O)/{(Ga)+(As)} at the surface layer is at least 0.15 and not more than 0.35, and a ratio of Ga atoms bound with O atoms to all Ga atoms and all As atoms (Ga—O)/{(Ga)+(As)} at the surface layer is at least 0.15 and not more than 0.35.

In the GaAs semiconductor substrate of the present invention, the surface roughness RMS can be set to not more than 0.3 nm. Furthermore, the concentration of alkali substances adhering to the surface can be set to not more than 0.4 ng/cm$^2$.

The present invention is also directed to a fabrication method of a GaAs semiconductor substrate, including a step of polishing a surface of a GaAs semiconductor wafer, an alkali cleaning step of cleaning the polished surface with an alkali cleaning solution, and an acid cleaning step of cleaning the surface subjected to alkali cleaning with an acid cleaning solution including 0.3 ppm to 0.5 mass % of acid.

In the fabrication method of a GaAs semiconductor substrate of the present invention, the alkali cleaning solution can include an organic alkali compound. The acid cleaning solution can include, as the acid, at least one type selected from the group consisting of hydrofluoric acid, hydrochloric acid, nitric acid, and nitrous acid. The fabrication method further includes a drying step of drying the surface subjected to acid cleaning, after the acid cleaning step. The drying step can be effected by rotating the GaAs semiconductor wafer to spin off the acid cleaning solution remaining at the surface. The fabrication method can further include a pure water cleaning step of cleaning the surface subjected to acid cleaning with pure water having a dissolved oxygen concentration of not more than 100 ppb, after the acid cleaning step. The fabrication method further includes a drying step of drying the surface subjected to pure water cleaning, after the pure water cleaning step. This drying step can be effected by rotating the GaAs semiconductor wafer in the atmosphere to spin off the pure water remaining at the surface.

According to a present invention, there can be provided a GaAs semiconductor substrate having a surface cleaned to an extent allowing removal of impurities and oxides at the surface by at least thermal cleaning of the substrate, and a fabrication method of such a GaAs semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
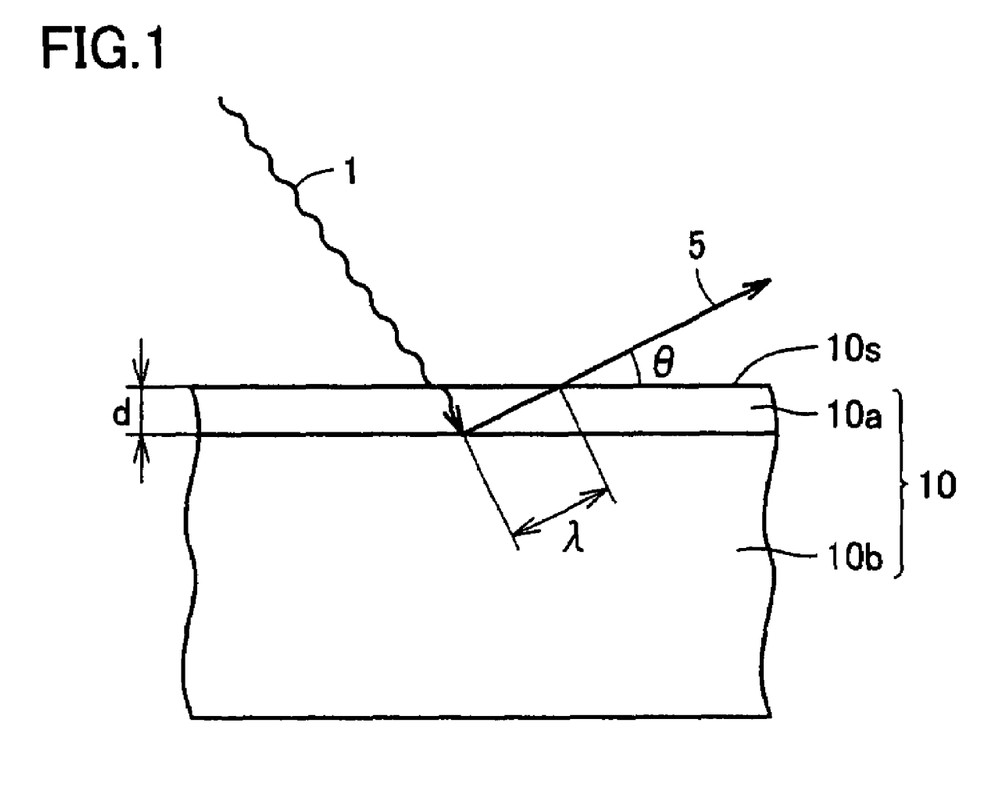
FIG. 1 is a schematic sectional view for describing X-ray photoelectron spectroscopy applied to a GaAs semiconductor substrate.
Figure 2:
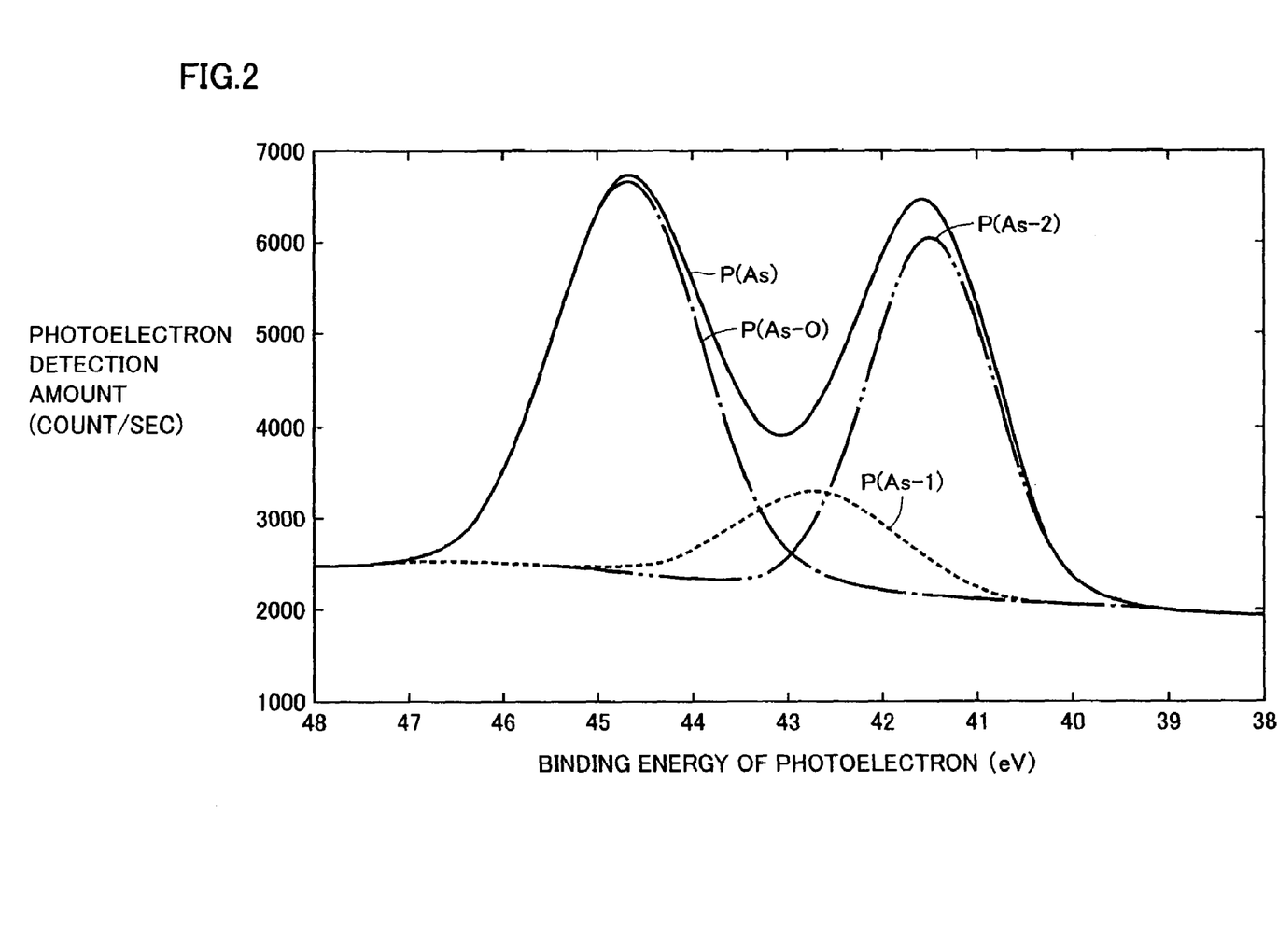
FIG. 2 is a schematic diagram of an example of a 3d electron spectrum of As atoms at a surface layer of a GaAs semiconductor substrate measured by X-ray photoelectron spectroscopy.
Figure 3:
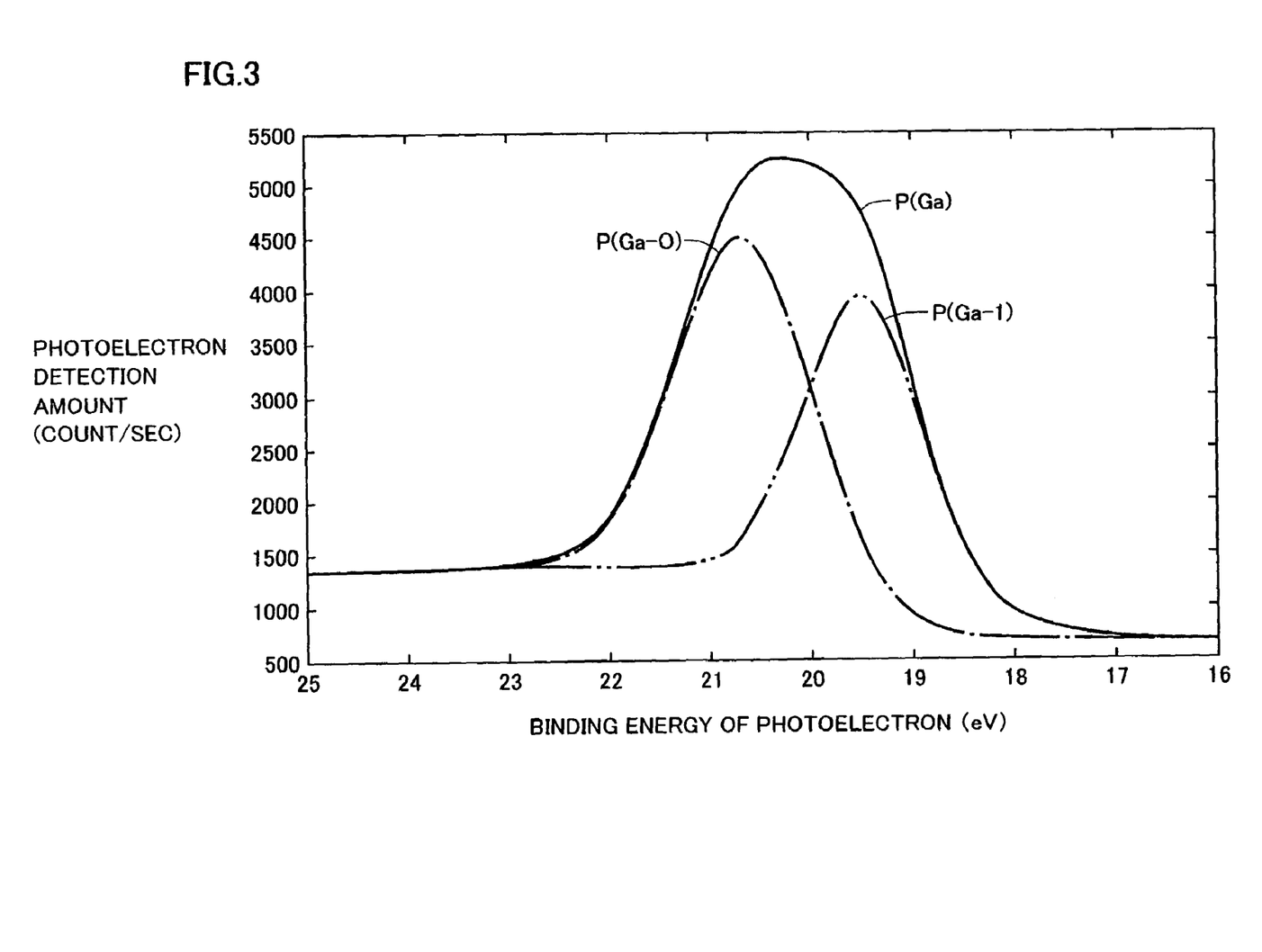
FIG. 3 is a schematic diagram of an example of a 3d electron spectrum of Ga atoms at a surface layer of a GaAs semiconductor substrate measured by X-ray photoelectron spectroscopy.

An embodiment of a GaAs semiconductor substrate of the present invention is directed to a GaAs semiconductor substrate 10 having a surface layer 10a, as shown in FIGS. 1-3. When the atomic ratio is calculated using a 3d electron spectrum of Ga atoms and As atoms measured under the condition of 10° for the photoelectron take-off angle θ by X-ray photoelectron spectroscopy (XPS), the structural atomic ratio of all Ga atoms to all As atoms (Ga)/(As) at the surface layer 10a is at least 0.5 and not more than 0.9, the ratio of As atoms bound with O atoms to all Ga atoms and all As atoms (As—O)/{(Ga)+(As)} at the surface layer 10a is at least 0.15 and not more than 0.35, and the ratio of Ga atoms bound with O atoms to all Ga atoms and all As atoms (Ga—O)/{(Ga)+(As)} at the surface layer 10a is at least 0.15 and not more than 0.35.

By setting the Ga/As ratio smaller as compared to the stoichiometric composition ratio (that is, (Ga)/(As)=1/1), formation of oxides on the substrate surface that cannot be removed by the general thermal cleaning of approximately 500 to 600° C. can be prevented. If the Ga/As ratio is lower than 0.5, excessive arsenic at the surface of the substrate will be deposited, leading to the formation of an arsenic oxide or metal arsenic. It is to be noted that metal arsenic is less susceptible to sublimation than arsenic oxides, and more difficult to remove by thermal cleaning. If the Ga/As ratio is higher than 0.9, formation of Ga oxides (oxides of high melting point such as $Ga_2O_3$) will be facilitated. Further, if the (As—O)/{(Ga)+(As)} ratio is lower than 0.15, coupling between As atoms and impurities will be facilitated. If (As—O)/{(Ga)+(As)} ratio is higher than 0.35, formation of arsenic oxides will be facilitated. In addition, fabrication of a substrate having a (Ga—O)/{(Ga)+(As)} ratio lower than 0.15 is difficult. If the (Ga—O)/{(Ga)+(As)} ratio is higher than 0.35, formation of gallium oxides (for example, oxides of high melting point such as $Ga_2O_3$) will be facilitated.

Therefore, by setting the (Ga)/(As) ratio to at least 0.5 and not more than 0.9, the (As—O)/{(Ga)+(As)} ratio to at least 0.15 and not more than 0.35, and the (Ga—O)/{(Ga)+(As)} ratio to at least 0.15 and not more than 0.35, there can be obtained a GaAs semiconductor substrate having a surface cleaned to an extent with few impurities adhering to the surface and oxides formed at the surface, and allowing removal of such impurities and oxides by general thermal cleaning at approximately 500 to 600° C.

The aforementioned (Ga)/(As) ratio, (As—O)/{(Ga)+(As)} ratio and (Ga—O)/{(Ga)+(As)} ratio are all calculated using the 3d electron spectrum of Ga atoms and As atoms measured under the condition of 10° for the photoelectron take-off angle θ by X-ray photoelectron spectroscopy. The X-ray photoelectron spectroscopy as well as the calculation of the (Ga)/(As) ratio, (As—O)/{(Ga)+(As)} ratio and (Ga—O)/{(Ga)+(As)} ratio will be described hereinafter.

Referring to FIG. 1, X-ray photoelectron spectroscopy (XPS) is a form of analyzing the type and bonding state of atoms at a surface layer 10a of a solid specimen (GaAs semiconductor substrate 10) taking advantage of the phenomenon that inner-shell electrons of atoms excited by an X-ray 1 are emitted from surface 10s of the substrate as photoelectrons 5, when a surface 10s of a solid specimen (GaAs semiconductor substrate 10) is irradiated with X-ray 1.

When surface 10s of GaAs semiconductor substrate 10 is irradiated with X-ray 1 in X-ray photoelectron spectroscopy, as shown in FIG. 1, the inner-shell electrons, for example 3d electrons, of the Ga atoms and As atoms constituting GaAs semiconductor substrate 10 excited by X-ray 1 are emitted from surface 10s of the substrate as photoelectrons 5. Therefore, the depth d from surface 10s of surface layer 10a that can be analyzed by X-ray photoelectron spectroscopy is determined by the depth of the excited 3d electrons losing energy by inelastic scattering. This depth d is also called electron escape depth d, defined as the distance of an electron with a certain energy traveling in a solid (GaAs semiconductor substrate 10) before losing that energy. In other words, Ga atoms and As atoms located in an inner layer 10b at the inner side of surface layer 10a in GaAs semiconductor substrate 10 cannot be analyzed since the photoelectrons thereof, even if excited by the X-ray, cannot be ejected from the surface. The beam source of the X-ray in the X-ray photoelectron spectroscopy generally includes, but not particularly limited to, the Kα ray of Al atoms or Kα ray of Mg atoms.

Although it is proper to consider that photoelectrons are emitted from the surface substantially isotropically, the electron escape depth d differs depending upon the photoelectron take-off angle θ. Referring to FIG. 1, the electron escape depth d is represented by the following equation (1):

$$d = \lambda \times \sin\theta \quad (1)$$

where λ is the mean free path of electrons and θ is the photoelectron take-off angle.

The 3 d electronic spectrum of As atoms and Ga atoms at surface layer 10a of GaAs semiconductor substrate 10 measured at 10° for the photoelectron take-off angle θ using the Kα ray of Al atoms as the X-ray source are shown in FIGS. 2 and 3.

The 3d electron spectrum of As atoms shown in FIG. 2 exhibits a wide 3d electron peak P (As) having two peaks. This 3d electron peak P (As) is divided into the three peaks of P (As—O), P (As-1) and P (As-2) in order from the higher binding energy of photoelectrons. The difference in the binding energy of the photoelectrons in these three peaks indicate the difference in the bonding state of As atoms. It is assumed that the P (As—O) peak among the three peaks is the 3d electron peak of As atoms bound with O atoms. Each peak area of P (As), P (As—O), P (As-1) and P (As-2) is proportional to the density of As atoms in a bonding state.

The 3d electron spectrum of Ga atom in FIG. 3 exhibits a wide 3d electron peak P (Ga). This 3d electron peak P (Ga) is divided into the two peaks of P (Ga—O) and P (Ga-1) in order from the higher binding energy of photoelectrons. The difference in the binding energy of the photoelectrons in these two peaks indicate the difference in the bonding state of Ga atoms. It is assumed that the P (Ga—O) peak among the two peaks is the 3d electron peak of Ga atoms bound with O atoms. Each peak area of P (Ga), P (Ga—O), and P (Ga-1) is proportional to the density of Ga atoms in a bonding state.

In X-ray photoelectron spectroscopy, the relative intensity of the 3d electron peak of respective measured atoms depends on the type of element. The measurement sensitivity may differ from each measurement. Therefore, in order to compare each peak area between different type of element of respective atoms in a quantitative manner, the employed peak area is based on each peak area obtained from the measurement chart corrected by the following equation (2):

$$(\text{Peak area of } P(M)) = (\text{peak area of } P(M) \text{ obtained from chart}) \times s(M)/f(M) \quad (2)$$

where P (M) is the peak of M atoms, f (M) is the relative intensity of that electron peak of M atoms, and s (M) is the measurement sensitivity when that peak of M atom is measured. The relative intensity f (Ga) of the 3d electron peak of Ga atoms is 0.42 whereas the relative intensity f (As) of 3d electron peak of As atoms is 0.48. The measurement sensitivity s(M) is read from the operation panel of the device at each measurement. In the present invention, each peak area of respective atoms refers to each peak area obtained from the measurement chart of respective atoms of each type of element corrected by equation (2).

Referring to FIGS. 1-3, the structural atomic ratio ((Ga)/(As) ratio) of all Ga atoms to all As atoms at surface layer 10a of GaAs semiconductor substrate 10 is calculated by the following equation (3).

$$(Ga)/(As) = (\text{peak area of } P(Ga))/(\text{peak area of } P(As)) \quad (3)$$

Referring to FIGS. 1 and 2, the ratio of As atoms bound with O atoms to all Ga atoms and all As atoms ((As—O)/{(Ga)+(As)} ratio) at surface layer 10a of GaAs semiconductor substrate 10 is calculated by the following equation (4):

$$(As—O)/\{(Ga)+(As)\} = (\text{peak area of } P(As—O))/\{(\text{peak area of } P(Ga))+(\text{peak area of } P(As))\} \quad (4)$$

Referring to FIGS. 1 and 3, the ratio of Ga atoms bound with O atoms to all Ga atoms and all As atoms (Ga—O)/{(Ga)+(As)} ratio at surface layer 10a of GaAs semiconductor substrate 10 is calculated by the following equation (5):

$$(Ga—O)/\{(Ga)+(As)\} = (\text{peak area of } P(Ga—O))/\{(\text{peak area of } P(Ga))+(\text{peak area of } P(As))\} \quad (5)$$

Referring to FIG. 1, the surface roughness RMS of surface 10s at GaAs semiconductor substrate 10 of the present embodiment is preferably not more than 0.3 nm. If the surface roughness RMS of the GaAs semiconductor substrate is greater than 0.3 nm, the surface area in contact with the atmosphere is increased, readily susceptible to contamination by the atmosphere. As used herein, surface roughness RMS corresponds to root mean square roughness, represented by the root of the average value of the square of the distance from the average plane to the measurement plane. Surface roughness RMS is measured by means of an atomic force microscope (AFM).

In GaAs semiconductor substrate 10 of the present embodiment shown in FIG. 1, the concentration of alkali substances adhering to surface 10 is preferably not more 0.4 ng/cm$^2$. If the concentration of alkali substances adhering to the surface exceeds 0.4 ng/cm$^2$, surface oxidation is facilitated to increase O atoms at the interface between the substrate and the epitaxial layer grown thereon. This leads to degradation in the property of the semiconductor device.

Second Embodiment

Figure 4:
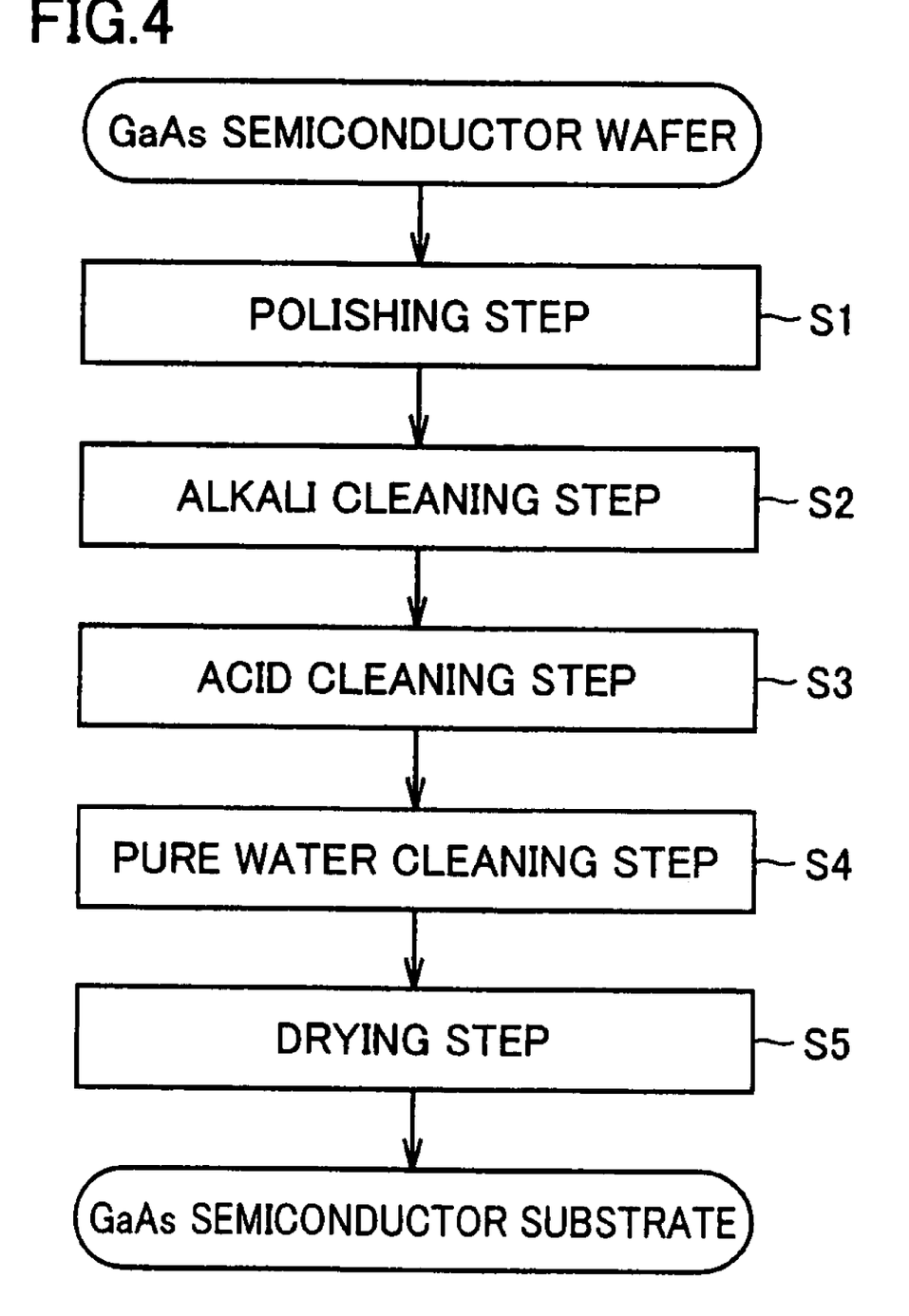
FIG. 4 is a flowchart of an embodiment of a fabrication method of a GaAs semiconductor substrate of the present invention.

According to an embodiment of the present invention, a fabrication method of a GaAs semiconductor substrate includes, as shown in FIG. 4, a polishing step S1 of polishing the surface of a GaAs semiconductor wafer, an alkali cleaning step S2 of cleaning the polished surface with an alkali cleaning solution, and an acid cleaning step S3 of cleaning the surface subjected to alkali cleaning with an acid cleaning solution including 0.3 ppm to 0.5 mass % acid.

The foreign objects in the polished agent and/or impurities adhering to the surface of the semiconductor wafer in the polishing step can be removed by the alkali cleaning step. Further, the impurities in the alkali cleaning solution adhering to the surface of semiconductor wafer in the alkali cleaning step can be removed by the acid cleaning step. The ratio of Ga atoms and As atoms on the surface is rendered appropriate by selecting an acid of an appropriate concentration in the acid cleaning solution to suppress generation of unnecessary gallium oxides.

Each step will be described in further detail with reference to FIG. 4. In polishing step S1, the surface of the GaAs semiconductor wafer is polished. By polishing step S1, the GaAs semiconductor wafer has a mirror surface. The polishing method in polishing step S1 is not particularly limited, and various polishing methods such as mechanical polishing, chemical mechanical polishing, or the like is employed.

In alkali cleaning step S2, the polished surface of the GaAs semiconductor wafer is cleaned with an alkali cleaning solution. By alkali cleaning step S2, foreign objects and/or impurities adhering to the surface of the GaAs semiconductor wafer in polishing step S1 are removed. Although not particularly limited, it is preferable to employ, for the alkali cleaning solution, an aqueous solution including 0.1 to 10 mass % of an organic alkali compound, absent of a metal element that affects electrical properties. For example, quaternary ammonium hydroxide such as choline, tetramethylammonium hydroxide (TMAH), or quaternary pyridinium hydroxide is preferably employed.

In acid cleaning step S3, the surface of the GaAs semiconductor substrate subjected to alkali cleaning is cleaned using an acid cleaning solution. By acid cleaning step S3, impurities adhering to the surface of the semiconductor wafer in the alkali cleaning step are removed. By employing an acid cleaning solution including 0.3 ppm to 0.5 mass % of acid in acid cleaning step S3, a GaAs semiconductor substrate is obtained wherein the (Ga)/(As) ratio is at least 0.5 and not more than 0.9, the (As—O)/{(Ga)+(As)} ratio is at least 0.15 and not more than 0.35, and the (Ga—O)/{(Ga)+(As)} Ga ratio is at least 0.15 and not more than 0.35, at the surface layer.

If the acid concentration in the acid cleaning solution is lower than 0.3 ppm, the modification action at the wafer surface is reduced, so that the effect of carbon dioxide ($CO_2$) gas dissolved from the atmospheric ambient into the acid cleaning solution is increased. This becomes the cause in variation of the chemical composition at the finished wafer surface. If the acid concentration of the acid cleaning solution is greater than 0.5 mass %, the stoichiometry at the wafer surface will be markedly As rich by the acid. During the pure water cleaning step, drying step, or transfer step, the region of the wafer surface where trace pure water adheres exhibits a change to the Ga rich side in stoichiometry due to the presence of trace carbon dioxide gas dissolved in the pure water. As a result, variation in the chemical composition in the wafer plane and between wafers is increased due to deviation in the condition of the pure water cleaning step. Particularly, the effect is significant in the case where wafer drying is carried out in the atmosphere. When As is excessively rich, the bonding of Ga—As is reduced, leading to the adverse effect of increase in oxygen at the wafer surface.

Although not particularly limited, the acid cleaning solution preferably includes at least one type selected from the group consisting of hydrofluoric acid (HF), hydrochloric acid (HCl), nitric acid ($HNO_3$), and nitrous acid ($HNO_2$) from the standpoint of high cleaning capability, absent of an element that affects the electrical characteristic (for example, metal element, sulfur, and the like), and avoiding grave secondary contamination and facility degradation by virtue of the acid component vaporized together with moisture when droplets of the solution are scattered around the facility. Further, it is preferable to include an organic acid such as acetic acid.

In addition, the acid cleaning solution preferably includes 0.3 ppm to 0.3 mass % of hydrogen peroxide ($H_2O_2$) from the standpoint of high washability. If the concentration of hydrogen peroxide ($H_2O_2$) in the acid cleaning solution is lower than 0.3 ppm, the effect of dissolved oxygen in the acid cleaning solution will become so great that the impurity removal promotion effect at the wafer surface is reduced. If the concentration of $H_2O_2$ in the acid cleaning solution exceeds 0.3 mass %, the etching rate at the wafer surface will become so high that an etched stepped portion will appear at the wafer surface, which is inappropriate for cleaning. In view of the foregoing, the concentration of $H_2O_2$ is preferably 0.3 ppm to 0.3 mass %.

Referring to FIG. 4 representing a fabrication method of a GaAs semiconductor substrate of the present embodiment, acid cleaning step S3 is preferably carried out by supplying an acid cleaning solution to the surface of the GaAs semiconductor wafer while the GaAs semiconductor wafer is rotated at 100 to 800 rpm with the main surface maintained horizontal. By supplying an acid cleaning solution to the surface of the GaAs semiconductor wafer during rotation thereof, the surface can be subjected to acid cleaning effectively while a film of the acid cleaning solution is formed to suppress oxidation at the surface. If the revolution speed of the GaAs semiconductor wafer is lower than 100 rpm, the cleaning efficiency cannot be increased. If the revolution speed is higher than 800 rpm, a film of the cleaning solution cannot be formed on the surface, leading to the possibility of contact with the atmosphere to induce oxidation at the surface.

The fabrication method of a GaAs semiconductor substrate of the present invention corresponding to FIG. 4 preferably includes a pure water cleaning step S4 of cleaning the surface of the GaAs semiconductor wafer subjected to acid cleaning with pure water, after acid cleaning step S3, preferably immediately after acid cleaning step S3. The cleaning method of pure water cleaning step S4 is not particularly limited, but is preferably carried out by cleaning the surface of the GaAs semiconductor wafer subjected to acid cleaning with pure water having a dissolved oxygen concentration (DO) of not more than 100 ppb for a period of not more than 5 minutes. By cleaning at the short period of not more than 5 minutes using pure water having a low dissolved oxygen concentration of not more than 100 ppb, oxidation at the surface can be suppressed. From the standpoint of further reducing oxidation, the dissolved oxygen concentration of pure water is preferably not more than 50 ppb. Further, from the standpoint of less impurities, the total organic carbon (TOC) of pure water is preferably not more than 40 ppb.

Further, in the fabrication method of the present embodiment, pure water cleaning step S4 is preferably carried out by supplying pure water to the surface of the GaAs semiconductor wafer while the GaAs semiconductor wafer is rotated at 100 to 800 rpm with the main surface maintained horizontal. By supplying pure water to the surface of the GaAs semiconductor wafer during rotation thereof, the surface can be cleaned with pure water effectively while a film of pure water is formed at the surface to suppress surface oxidation. If the revolution speed of the GaAs semiconductor wafer is lower than 100 rpm, the cleaning efficiency cannot be increased. If this revolution speed is higher than 800 rpm, a film of pure water cannot be formed on the surface, so that the contact between the surface and the atmosphere will become direct and intense, leading to promotion of oxidation.

Further, the fabrication method of a GaAs semiconductor substrate of the present embodiment corresponding to FIG. 4 further includes a drying step S5 of drying the surface of the GaAs semiconductor wafer after acid cleaning step S3 or pure water cleaning step S4, preferably immediately after acid cleaning step S3 or pure water cleaning step S4. In drying step S5, the acid cleaning solution or pure water remaining on the surface is preferably spun off by rotating the GaAs semiconductor wafer at the revolution speed of at least 2000 rpm. By rotating the GaAs semiconductor wafer at a high speed of at least 2000 rpm to spin off the acid cleaning solution or pure water on the surface, the wafer surface can be dried uniformly and effectively.

Third Embodiment

Figure 5:
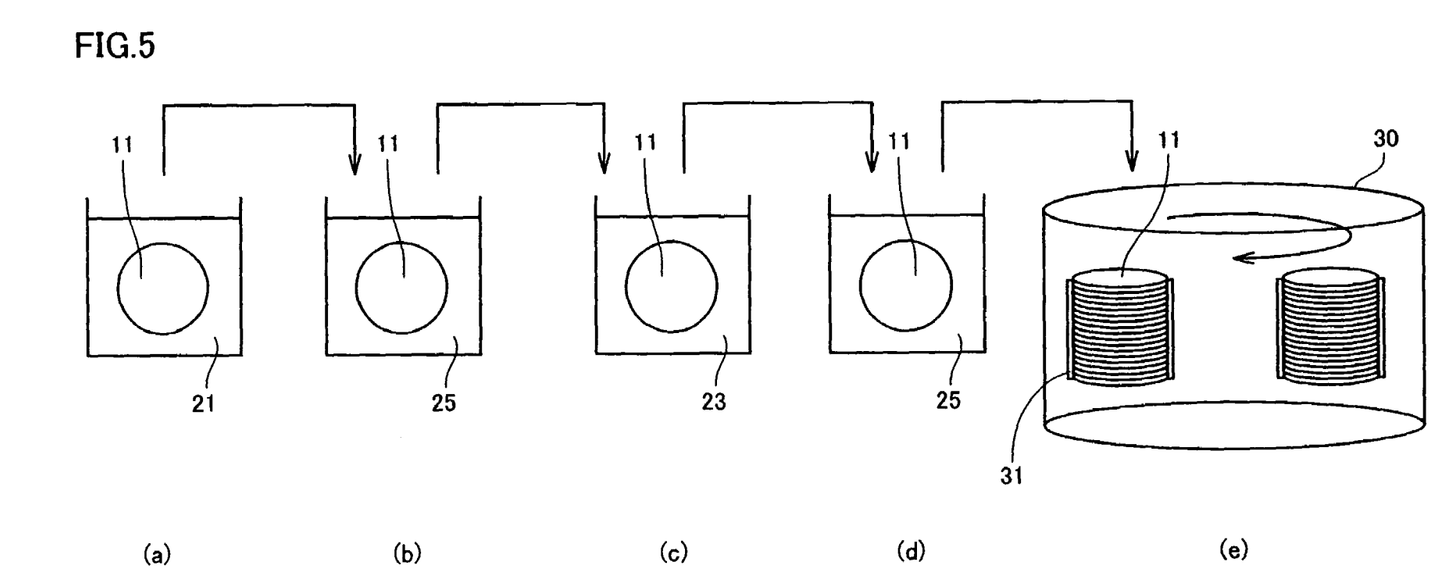
FIG. 5 is a schematic diagram of another embodiment of a fabrication method of a GaAs semiconductor substrate of the present invention, wherein (a) corresponds to an alkali cleaning step, (b) corresponds to a first pure water cleaning step, (c) corresponds to an acid cleaning step, (d) corresponds to a second pure water cleaning step, and (e) corresponds to a drying step.

A fabrication method of a GaAs semiconductor substrate according to another embodiment of the present invention includes, as shown in FIG. 5, an alkali cleaning step (FIG. 5 (a)) of cleaning the polished surface of GaAs semiconductor wafer 11 first with an organic solvent such as alcohol, and then with an alkali cleaning solution 21, and an acid cleaning step (FIG. 5 (c)) of cleaning the alkali-cleaned surface with an acid cleaning solution 23 including 0.3 ppm to 0.5 mass % of acid. The present embodiment is directed to cleaning GaAs semiconductor wafer 11 in batch form, and further includes a first pure water cleaning step (FIG. 5 (b)) of cleaning the alkali-cleaned surface with pure water 25, between the alkali cleaning step and acid cleaning step, a second pure water cleaning step (FIG. 5 (d)) of cleaning the surface subjected to acid cleaning with pure water, after the acid cleaning step, and the step (FIG. 5 (e)) of drying the pure water remaining at the surface cleaned with pure water, after the second pure water cleaning step.

The drying step (FIG. 5 (e)) is preferably carried out by securing GaAs semiconductor wafer 11 to a wafer holder 31 in a centrifuge 30 to spin off pure water remaining on the surface of the GaAs semiconductor wafer. The alkali cleaning solution employed for alkali cleaning, the acid cleaning solution employed for acid cleaning, and the pure water employed for pure water cleaning are similar to those employed in the second embodiment.

With regards to the acid of the acid cleaning solution, inorganic acid such as hydrofluoric acid, hydrochloric acid, nitric acid, and nitrous acid, as well as organic acid such as acetic acid, citric acid and malic acid are preferably employed from the standpoint of high cleaning capability and absent of an element that affects the electrical characteristics (for example, metal element, sulfur, and the like). Further, a combination of two or more types of such acids, for example a combination of hydrochloric acid and nitric acid, is preferably employed. The acid concentration thereof is preferably 0.3 ppm to 0.5 mass %, likewise the second embodiment.

The method of adding acid can be carried out by diluting an acid aqueous solution of high concentration, in addition to dissolving acid gas such as hydrogen chloride (HCl) gas, carbon dioxide ($CO_2$) gas, or nitrogen oxide ($NO_x$) gas in pure water.

EXAMPLES

Example A

1. Fabrication of GaAs Semiconductor Substrate (1) Production of GaAs Semiconductor Wafer (Wafer Production Step)

A GaAs semiconductor crystal grown by vertical Bridgeman (VB) method was sliced with a wire saw. The edge was ground to have the outer configuration shaped. Three GaAs semiconductor wafers were produced. For the purpose of removing the saw mark caused by the wire saw, the surface of the wafer was ground by a surface grinding machine. Then, the circumferential chamfer was ground with a rubber abrasive tool.

(2) Polishing of GaAs Semiconductor Wafer Surface (Polishing Step)

In a clean room, the surface of each GaAs semiconductor wafer was polished by means of a hard abrasive cloth with a mixture of chlorine based abrasive agent and silica powder. Then, the surface of each GaAs semiconductor wafer was polished with INSEC NIB abrasive agent (product of Fujimi Incorporation) to achieve a mirror surface. Foreign objects such as debris of the abrasive cloth and abrasive agent adhered to the mirror surface of each GaAs semiconductor wafer.

(3) Alkali Cleaning of GaAs Semiconductor Wafer Surface (Alkali Cleaning Step)

Each GaAs semiconductor wafer with foreign objects at the surface was immersed in a choline aqueous solution of 0.1 to 10 mass %. Ultrasonic waves of 0.9 to 1.5 MHz were applied for 3 to 12 minutes in the aqueous solution for alkali cleaning of the surface. Then, the surface of each GaAs semiconductor wafer was cleaned with pure water, followed by drying with a spin drier. The surface roughness RMS of the obtained GaAs semiconductor wafer was measured in the range of 0.5 μm×0.5 μm by AFM. The values were 0.08 to 0.15 nm.

(4) Acid Cleaning of GaAs Semiconductor Wafer Surface (Acid Cleaning Step)

Then, each GaAs semiconductor wafer was placed in a cleaning device including a mechanism that can rotate the wafer with the main surface maintained horizontal. At this stage, each GaAs semiconductor wafer was held by a centrifugal force type chuck arranged in the cleaning device. This centrifugal force type chuck is formed of resin that produces little dust such as polyamide resin, polyether etherketone resin, and the like.

An aqueous solution including 0.1 to 0.6 mass % of HF and 0.05 to 0.3 mass % of $H_2O_2$ was supplied as the acid cleaning solution to the surface of each GaAs semiconductor wafer while the wafer was rotated at 300 to 600 rpm for acid cleaning for 6 to 20 seconds.

(5) Pure Water Cleaning of GaAs Semiconductor Wafer Surface (Pure Water Cleaning Step)

Pure water of 1 to 40 ppb of total organic carbon having a dissolved oxygen concentration of 0.1 to 50 ppb was supplied to the surface of each GaAs semiconductor wafer while the wafer was rotated at 300 to 600 rpm for pure water cleaning for 15 to 30 seconds. Then, the pure water set forth above applied with ultrasonic waves of 0.5 to 2.5 MHz was supplied to the wafer from a pure water nozzle whose leading end is distant from the wafer by 0.5 to 2.5 cm, moving radial of the wafer, whereby the surface was subjected to ultrasonic wave cleaning for 8-20 seconds with the pure water set forth above.

(6) Drying of GaAs Semiconductor Wafer (Drying Step)

Supply of pure water was ceased, and the GaAs semiconductor wafer was rotated for 15 to 30 seconds at 2500 rpm to dry the surface of the GaAs semiconductor wafer. Thus, three GaAs semiconductor substrates were obtained.

2. Analysis of Surface Layer of GaAs Semiconductor Substrate

Referring to FIG. 1, the 3d electron spectrum of As atoms and Ga atoms at a surface layer 10*a* of each obtained GaAs semiconductor substrate 10 was measured using an X-ray photoelectron spectroscopy device (ESCA5400MC by PHI Corporation). the Kα ray of Al atoms was employed as the X-ray source, and the photoelectron take-off angle θ was 10°.

Referring to FIGS. 2 and 3, the Ga/As ratio, the (As—O)/{(Ga)+(As)} ratio and the (Ga—O)/{(Ga)+(As)} ratio of each GaAs semiconductor substrate were calculated using the aforementioned equations (2) to (5), based on peaks P (As) and P (As—O) appearing at the 3d electron spectrum of As atoms, and peaks P (Ga) and P (Ga—O) appearing at the 3d electron spectrum of Ga atoms for each GaAs semiconductor substrate. The Ga/As ratio, the (As—O)/{(Ga)+(As)} ratio, and the (Ga—O)/{(Ga)+(As)} ratio were within the range of 0.5 to 0.9, 0.15 to 0.35, and 0.15 to 0.35, respectively, for each GaAs semiconductor substrate.

3. Growth of Epitaxial Layer on GaAs Semiconductor Substrate

An $Al_xGa_{1-x}N$ (x=0.2) semiconductor layer was grown as an epitaxial layer to the thickness of 1 μm on each of the three GaAs semiconductor substrates set forth above by metal organic chemical vapor deposition (MOCVD) to obtain three GaAs semiconductor substrates with an epitaxial layer.

Figure 6:
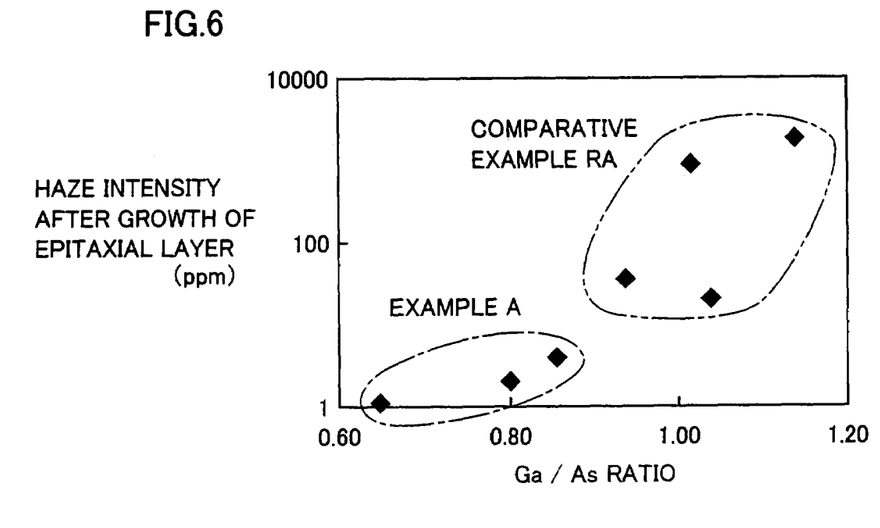
FIG. 6 is a schematic diagram representing the relationship between the Ga/As ratio at the surface layer of the substrate and the haze strength subsequent to epitaxial layer growth.

4. Physical Property Evaluation of GaAs Semiconductor Substrate with Epitaxial Layer Referring to FIG. 6, the haze intensity obtained by irradiating the surface of the GaAs semiconductor substrate after growth of an epitaxial layer with Ar laser and collecting the light by diffused reflection (haze intensity after epitaxial layer growth) for each GaAs semiconductor substrate with an epitaxial layer (the three points in Example A in FIG. 6) was extremely low, in the range of 1.1 to 4.0 ppm. A favorable surface was obtained. In other words, it was identified that the surface of the epitaxial layer formed on a GaAs semiconductor substrate having a Ga/As ratio of 0.9 at most was favorable.

Figure 7:
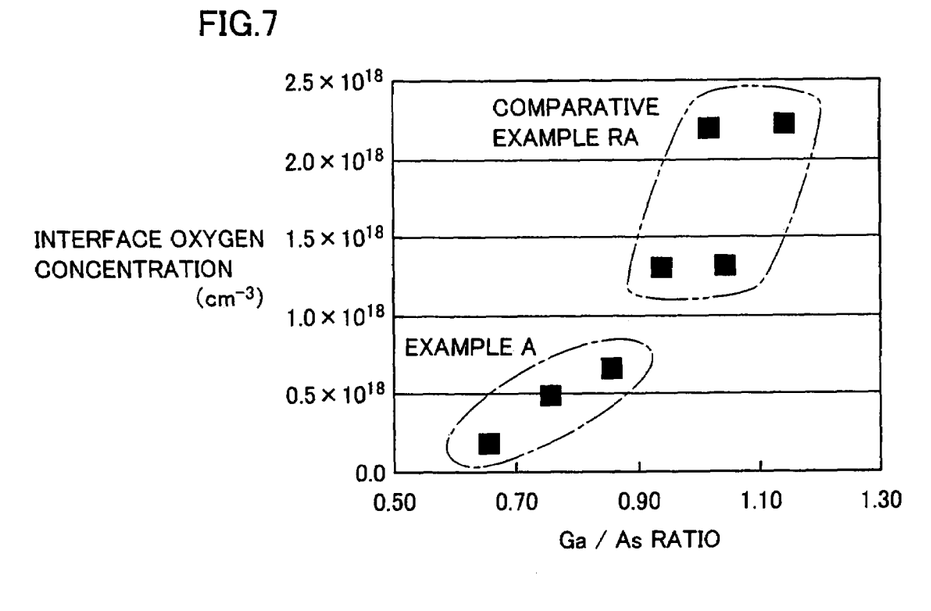
FIG. 7 is a schematic diagram representing the relationship between the Ga/As ratio at the surface layer of the substrate and the oxygen concentration at the interface between the substrate and epitaxial layer.

Referring to FIG. 7, the oxygen concentration at the interface region between the GaAs semiconductor substrate and epitaxial layer (interface oxygen concentration) was measured for each GaAs semiconductor substrate with an epitaxial layer (the three points in Example A in FIG. 7) based on secondary ion mass spectroscopy (SIMS). The measured value was not more than $1\times10^{18}$ cm$^{-3}$, corresponding to extremely low concentration. In other words, it was identified that the interface oxygen concentration between a GaAs semiconductor substrate having a Ga/As ratio of 0.9 at most and the epitaxial layer formed thereon was extremely low.

In a manner similar to that of Example A provided that an aqueous solution including 0.05 mass % of HF and 0.1 mass % of $H_2O_2$ was employed as the acid cleaning solution in the acid cleaning step, three GaAs semiconductor substrates were obtained for each of the four types of different ammonia concentration at the surface. Specifically, the four types of ammonia concentration were 0.2 ng/cm$^2$, 0.4 ng/cm$^2$, 0.5 ng/cm$^2$, and 1 ng/cm$^2$. One of the GaAs semiconductor substrates was used for determining the ammonia concentration at the surface. As used herein, the ammonia concentration at the substrate surface was determined by immersing the substrate in pure water, and then measuring the ammonia concentration of the pure water by ion chromatography. One of the substrates had an epitaxial layer grown in a manner similar to that of Example A, immediately after the drying step subsequent to the series of cleaning steps. One substrate had an epitaxial layer grown on the substrate in a manner similar to that of Example A, after being left for two hours in an ammonia atmosphere of 20 μg/m$^3$ at 22 to 25° C., after the acid cleaning step, pure water cleaning step, and drying step.

Figure 8:
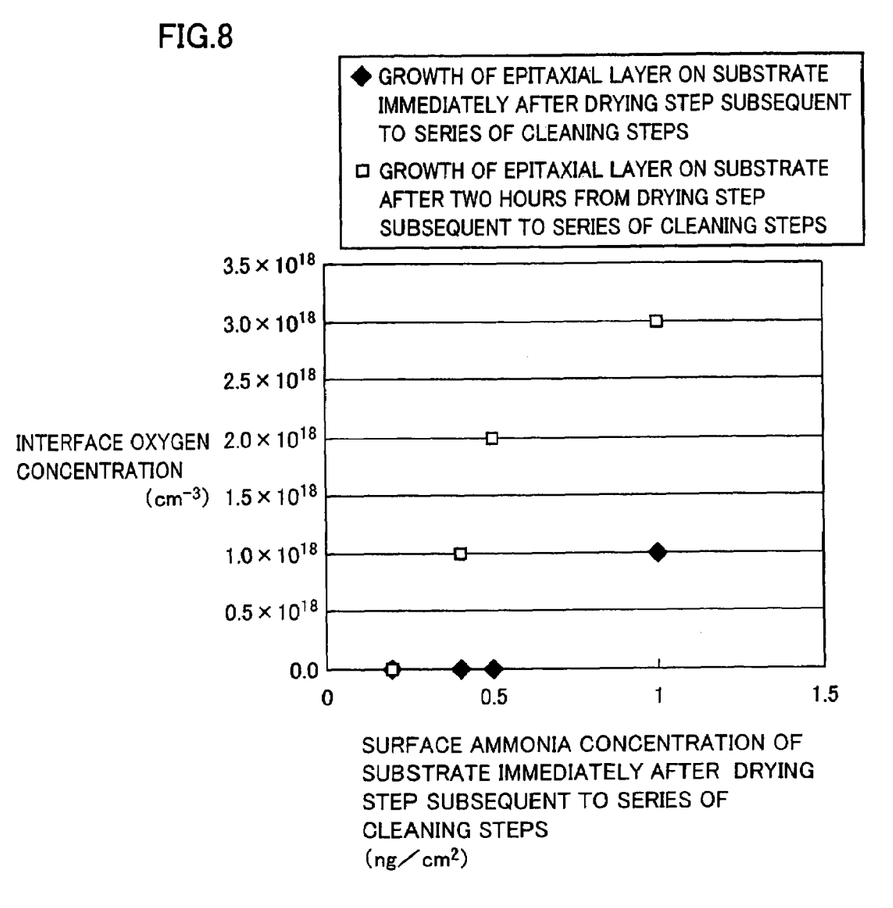
FIG. 8 is a schematic diagram representing the relationship between the ammonia concentration at the substrate surface immediately after the drying step subsequent to the series of cleaning steps, and the oxygen concentration at the interface between the substrate and epitaxial layer.

It is appreciated from FIG. 8 that, by leaving the substrate in an atmosphere including ammonia (for example, in the atmosphere) even if the ammonia concentration at the surface immediately after the drying step subsequent to the series of cleaning steps set forth above is low, the interface oxygen concentration between the substrate and the epitaxial layer grown after exposure to ammonia was higher as compared to the interface oxygen concentration between the substrate and the epitaxial layer formed immediately after the drying step subsequent to the series of cleaning steps. This is probably because the alkali substances such as ammonia in the atmosphere reacts with the F atoms on the substrate surface to cause generation of salt, leading to promotion of oxidation at the substrate surface.

A survey of FIG. 8 indicates that the interface oxygen concentration between the substrate and the epitaxial layer can be suppressed at a low level of $1.0\times10^{18}$ cm$^{-3}$ at most even if an epitaxial layer is formed after the substrate has been left for two hours as long as the initial ammonia concentration at the surface of the substrate is not more than 0.4 ng/cm$^2$. It was therefore appreciated that the concentration of alkali substances adhering to the surface of the GaAs semiconductor substrate is preferably not more than 0.4 ng/cm$^2$.

Comparative Example RA

1. Production of GaAs Semiconductor Substrate

Four GaAs semiconductor substrates were produced in a manner similar to that of Example A, provided that the acid cleaning step was not carried out.

2. Analysis of Surface Layer of GaAs Semiconductor Substrate

The Ga/As ratio, the (As—O)/{(Ga)+(As)} ratio, and the (Ga—O)/{(Ga)+(As)} ratio of each GaAs semiconductor substrate were calculated in a manner similar to that of Example A. The Ga/As ratio, the (As—O)/{(Ga)+(As)} ratio, and the (Ga—O)/{(Ga)+(As)} ratio were 0.90 to 1.52, 0.40 to 0.65, and 0.30 to 0.70, respectively, for each of the GaAs semiconductor substrate.

3. Growth of Epitaxial Layer on GaAs Semiconductor Substrate

An epitaxial layer was grown, in a manner similar to that of Example A, on each of the four GaAs semiconductor substrates set forth above to obtain four GaAs semiconductor substrates with an epitaxial layer.

4. Physical Property Evaluation of GaAs Semiconductor Substrate with Epitaxial Layer The haze intensity subsequent to growing an epitaxial layer in a manner similar to that of Example A for each GaAs semiconductor substrate with an epitaxial layer (4 points in Comparative Example RA in FIG. 6) was 21 to 1870 ppm, higher as compared to Example A. A favorable surface could not be obtained.

Further, referring to FIG. 7, the interface oxygen concentration measured in a manner similar to that of Example A for each GaAs semiconductor substrate with an epitaxial layer (the four points in Comparative Example RA in FIG. 7) was higher than $1\times10^{18}$ cm$^{-3}$.

Example B1

1. Fabrication of GaAs Semiconductor Substrate

In a manner similar to that of Example A, a GaAs semiconductor wafer was produced and the surface thereof was subjected to polishing. Referring to FIG. 5 (a), the GaAs semiconductor wafer having the surface polished was immersed in 0.5 mass % of tetramethyl ammonium hydroxide (TMAH) solution. Ultrasonic waves of 950 kHz were applied for 10 minutes in the aqueous solution for alkali cleaning of the surface. Referring to FIG. 5 (b), the surface of the GaAs semiconductor wafer was subjected to pure water cleaning, in a manner similar to that of Example A. Referring to FIG. 5 (c), the GaAs semiconductor wafer was immersed in 0.3 ppm of hydrochloric acid (HCl) solution. Ultrasonic waves of 950 kHz were applied for 2 minutes in the solution for acid cleaning of the surface. Referring to FIG. 5 (d), the surface of the GaAs semiconductor wafer was cleaned with pure water in a manner similar to that of Example A. Referring to FIG. 5 (e), GaAs semiconductor wafer 11 was secured to wafer holder 31 in centrifuge 30 and rotated at the high speed of 2500 rpm for 30 seconds. Accordingly, the pure water remaining at the surface of the GaAs semiconductor wafer was spun off, whereby the surface of the wafer was dried. Thus, a GaAs semiconductor substrate was obtained.

2. Analysis of Surface Layer of GaAs Semiconductor Substrate

In a manner similar to that of Example A, the 3d electron spectrum of As atoms and Ga atoms at the surface layer of the obtained GaAs semiconductor substrate was measured. The Ga/As ratio, the (As—O)/{(Ga)+(As)} ratio, and the (Ga—

O)/{(Ga)+(As)} ratio were 0.80, 0.27, and 0.15, respectively, for the GaAs semiconductor substrate of Example B1.

3. Growth of Epitaxial Layer on GaAs Semiconductor Substrate

On the GaAs semiconductor substrate set forth above, an epitaxial layer was grown in a manner similar to that of Example A to obtain a GaAs semiconductor substrate with an epitaxial layer. The haze intensity after growing an epitaxial layer obtained in a manner similar to that of Example A for the present GaAs semiconductor substrate with an epitaxial layer was 2.1 ppm, which is equally low as in Example A. A favorable flat surface was obtained. The haze intensity was measured using Surfscan6220 made by KLA-Tencor.

Example B2

A GaAs semiconductor substrate was obtained in a manner similar to that of Example B1, provided that 0.6 ppm of nitric acid ($HNO_3$) aqueous solution was employed as the acid cleaning aqueous solution. The Ga/As ratio, the (As—O)/{(Ga)+(As)} ratio, and the (Ga—O)/{(Ga)+(As)} ratio were 0.85, 0.28 and 0.22, respectively, for the obtained GaAs semiconductor substrate. Further, an epitaxial layer was grown on the GaAs semiconductor substrate in a manner similar to that of Example B1 to obtain a GaAs semiconductor substrate with an epitaxial layer. The haze intensity after growing an epitaxial layer was 1.5 ppm, which is equally low as in Example B1. A favorable flat surface was obtained.

Example B3

A GaAs semiconductor substrate was obtained in a manner similar to that of Example B1, provided that an aqueous solution including 0.3 ppm of hydrochloric acid and 1.2 ppm of nitric acid was employed as the acid cleaning aqueous solution. By the reaction between hydrochloric acid and nitric acid in the aqueous solution, approximately 0.6 ppm of nitrous acid was generated from the nitric acid. The Ga/As ratio, the (As—O)/{(Ga)+(As)} ratio, and the (Ga—O)/{(Ga)+(As)} ratio were 0.84, 0.29, and 0.21, respectively, for the obtained GaAs semiconductor substrate. Furthermore, an epitaxial layer was grown on the GaAs semiconductor substrate in a manner similar to that of Example B1 to obtain a GaAs semiconductor substrate with an epitaxial layer. The haze intensity after growing an epitaxial layer was 2.2 ppm, which is equally low as in Example B1. A favorable flat surface was obtained.

Comparative Example RB1

A GaAs semiconductor substrate was obtained in a manner similar to that of Example B1, provided that the GaAs semiconductor wafer was not subjected to acid cleaning. The Ga/As ratio, the (As—O)/{(Ga)+(As)} ratio, and the (Ga—O)/{(Ga)+(As)} ratio were 1.03, 0.17, and 0.19, respectively, for the obtained GaAs semiconductor substrate. Furthermore, an epitaxial layer was grown on the GaAs semiconductor substrate, in a manner similar to that of Example B1 to obtain a GaAs semiconductor substrate with an epitaxial layer. The haze intensity after growing an epitaxial layer was 140.0 ppm, considerably higher than those of Example A, and Examples B1-B3. A favorable flat surface could not be obtained.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A GaAs semiconductor substrate having a surface layer located at a surface, wherein
   when an atomic ratio is measured using a 3d electron spectrum of Ga atoms and As atoms measured at a condition of 10° for a photoelectron take-off angle θ by X-ray photoelectron spectroscopy,
   a structural atomic ratio of all Ga atoms to all As atoms (Ga)/(As) at said surface layer is at least 0.5 and not more than 0.9,
   a ratio of As atoms bound with O atoms to all Ga atoms and all As atoms (As—O)/{(Ga)+(As)} ratio at said surface layer is at least 0.15 and not more than 0.35, and
   a ratio of Ga atoms bound with O atoms to all Ga atoms and all As atoms (Ga—O)/{(Ga)+(As)} at said surface layer is at least 0.15 and not more than 0.35, and a concentration of ammonium salt adhering to said surface, wherein said concentration of ammonium salt is less than 0.4 $ng/cm^2$.

2. The GaAs semiconductor substrate according to claim 1, wherein a surface roughness RMS is not more than 0.3 nm.

* * * * *